United States Patent
Di Sarro et al.

(10) Patent No.: US 9,240,471 B2
(45) Date of Patent: Jan. 19, 2016

(54) SCR WITH FIN BODY REGIONS FOR ESD PROTECTION

(71) Applicant: INTERNATIONAL BUSINESS MACHINES CORPORATION, Armonk, NY (US)

(72) Inventors: James P. Di Sarro, Essex Junction, VT (US); Robert J. Gauthier, Jr., Hinesburg, VT (US); Tom C. Lee, Essex Junction, VT (US); Junjun Li, Williston, VT (US); Souvick Mitra, Essex Junction, VT (US); Christopher S. Putnam, Hinesburg, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/011,789

(22) Filed: Aug. 28, 2013

(65) Prior Publication Data

US 2015/0060939 A1     Mar. 5, 2015

(51) Int. Cl.
| | |
|---|---|
| *H01L 27/02* | (2006.01) |
| *H01L 29/74* | (2006.01) |
| *G06F 17/50* | (2006.01) |
| *H01L 29/06* | (2006.01) |
| *H01L 29/66* | (2006.01) |

(52) U.S. Cl.
CPC .......... *H01L 29/742* (2013.01); *G06F 17/5063* (2013.01); *G06F 17/5072* (2013.01); *H01L 29/0649* (2013.01); *H01L 29/0657* (2013.01); *H01L 29/66121* (2013.01); *H01L 29/7408* (2013.01); *H01L 27/0262* (2013.01); *H01L 29/66393* (2013.01); *H01L 29/7436* (2013.01)

(58) Field of Classification Search
CPC ............ H01L 27/0262; H01L 29/7436; H01L 29/66393; H01L 29/0839
USPC .......................... 438/135; 257/140; 716/118
See application file for complete search history.

(56) References Cited

U.S. PATENT DOCUMENTS

| | | |
|---|---|---|
| 7,638,370 B2 | 12/2009 | Gossner et al. |
| 7,923,266 B2 | 4/2011 | Thijs et al. |
| 7,943,438 B2 | 5/2011 | Gauthier et al. |
| 8,236,624 B2 | 8/2012 | Gossner et al. |
| 8,310,027 B2 | 11/2012 | Russ et al. |
| 8,361,872 B2 | 1/2013 | Cai et al. |
| 8,384,125 B2 | 2/2013 | Gauthier et al. |
| 8,420,476 B2 | 4/2013 | Booth et al. |
| 2007/0262386 A1 | 11/2007 | Gossner et al. |
| 2009/0309167 A1 | 12/2009 | Russ et al. |
| 2010/0062573 A1 | 3/2010 | Gossner et al. |
| 2010/0207161 A1 | 8/2010 | Shrivastava et al. |

(Continued)

OTHER PUBLICATIONS

O. Marichal et al., "SCR-based ESD Protection in Nanometer SOI Technologies," 2005 EOS/ESD Symposium, 9 pages.

(Continued)

*Primary Examiner* — Walter H Swanson
(74) *Attorney, Agent, or Firm* — Anthony Canale; Andrew M. Calderon; Roberts Mlotkowski Safran & Cole, P.C.

(57) ABSTRACT

An electrostatic discharge protection circuit is disclosed. A method of manufacturing a semiconductor structure includes forming a semiconductor controlled rectifier including a first plurality of fingers between an n-well body contact and an anode in an n-well, and a second plurality of fingers between a p-well body contact and a cathode in a p-well.

16 Claims, 11 Drawing Sheets

(56) References Cited

U.S. PATENT DOCUMENTS

| | | |
|---|---|---|
| 2012/0178222 A1* | 7/2012 | Abou-Khalil et al. ........ 438/133 |
| 2012/0299099 A1 | 11/2012 | Huang et al. |
| 2012/0305984 A1 | 12/2012 | Campi et al. |
| 2012/0319164 A1 | 12/2012 | Inaba |
| 2012/0326766 A1 | 12/2012 | Camillo-Castillo et al. |
| 2013/0134479 A1 | 5/2013 | Xu et al. |
| 2013/0141823 A1 | 6/2013 | Di Sarro et al. |
| 2013/0161687 A1* | 6/2013 | Abou-Khalil et al. ........ 257/121 |

OTHER PUBLICATIONS

J. Li et al., "Technology Scaling of Advanced Bulk CMOS On-Chip ESD Protection Down to the 32nm Node." EOS/ESD Symposium, 2009, 7 pages.

S. Thijs et al., "Advanced ESD Power Clamp Design for SOI FinFET CMOS Technology," IEEE International Conference on IC Design and Technology (ICICDT), 2010, pp. 43-46.

S. Thijs et al., "On Gated Diodes for ESD Protection in Bulk FinFET CMOS Technology." EOS/ESD Symposium, 2011, 8 pages.

* cited by examiner

SCR WITH FIN BODY REGIONS FOR ESD PROTECTION

FIELD OF THE INVENTION

The invention relates to integrated circuits and, more particularly, to electrostatic discharge (ESD) protection circuits in integrated circuits.

BACKGROUND

Modern electronics achieve high levels of functionality in small form factors by integrating multiple functions onto a single chip. A common fabrication process that allows high levels of integration at a relatively low cost is complementary metal-oxide-semiconductor (CMOS). CMOS processes build a combination of p-type and n-type metal-oxide-semiconductor field-effect transistors (MOSFETs) to implement logic gates and other types of digital circuits.

Chips may be exposed to ESD events leading to potentially large and damaging currents within the integrated circuit. Increasing integration densities and performance demands on CMOS chips have resulted in reduced device dimensions. The reduction in dimensions has increased the susceptibility of integrated circuits to ESD events. Manufacturers, assemblers, and users of integrated circuits therefore take precautions to avoid ESD-based damage. For example, ESD prevention can be incorporated into the integrated circuit and may include special design techniques for input/output (I/O) pins and pads to prevent damage to the chip during handling from the time that the chip is manufactured until the time that the chip is installed on a circuit board.

Effective ESD protection for a power supply pad typically requires a circuit that provides a low impedance path to shunt ESD currents away from the integrated circuit during the ESD event, but remains in a high impedance state when the integrated circuit is powered under non-ESD conditions. Circuits that include a clamp device, such as a semiconductor-controlled rectifier (SCR) are often used to provide this type of ESD protection in CMOS applications. An SCR typically provides a high level of ESD protection at a low capacitance, which is desirable for high frequency circuits such as application specific integrated circuit (ASIC) high speed serial (HSS) links and the like.

SUMMARY

In a first aspect of the invention, there is a method of manufacturing a semiconductor structure. The method includes forming a semiconductor controlled rectifier including a first plurality of fingers between an n-well body contact and an anode in an n-well, and a second plurality of fingers between a p-well body contact and a cathode in a p-well.

In another aspect of the invention, there is a semiconductor controlled rectifier in an integrated circuit including a first plurality of fingers between an n-well body contact and an anode in an n-well. The semiconductor controlled rectifier also includes at least one first dielectric structure between ones of the first plurality of fingers. The semiconductor controlled rectifier additionally includes a second plurality of fingers between a p-well body contact and a cathode in a p-well. The semiconductor controlled rectifier further includes at least one second dielectric structure between ones of the second plurality of fingers.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a circuit for a semiconductor controlled rectifier which comprises the structures of the present invention. In still further embodiments, a method in a computer-aided design system is provided for generating a functional design model of the semiconductor controlled rectifier. The method comprises generating a functional representation of the structural elements of the semiconductor controlled rectifier.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuits and, more particularly, to electrostatic discharge (ESD) protection circuits in integrated circuits. According to aspects of the invention, a semiconductor-controlled rectifier (SCR) having fin body regions is provided in an ESD protection circuit. In embodiments, the SCR includes a plurality of semiconductor material fins extending between an n-well body contact and an anode in an n-well. The use of fins alternating with insulator material in this region, rather than solid semiconductor material throughout the entire region, reduces the body contact junction area, which reduces the capacitance of the SCR. In embodiments, the SCR also includes a plurality of semiconductor material fins arranged in a p-well between a p-well body contact and a cathode in the p-well. The use of fins alternating with insulator material in this region, rather than solid semiconductor material throughout the entire region, increases the resistance in the p-well, which reduces the trigger current and improves triggering characteristics. In this manner, implementations of the invention provide a low capacitance SCR for ESD protection.

In aspects the invention, an ESD protection circuit includes an SCR in the form of a diode triggered SCR (DTSCR) implemented in an active region of a semiconductor-on-insulator (SOI) substrate. The DTSCR exhibits a lowest capacitance for a given ESD protection level in advanced SOI CMOS technologies, e.g., compared to a polysilicon gate stack-bounded diode and nitride spacer-bounded diode. However, the invention is not limited to use with an SOI substrate, and the DTSCR may be implemented in an active region of a bulk semiconductor substrate, for example.

Figure 1:
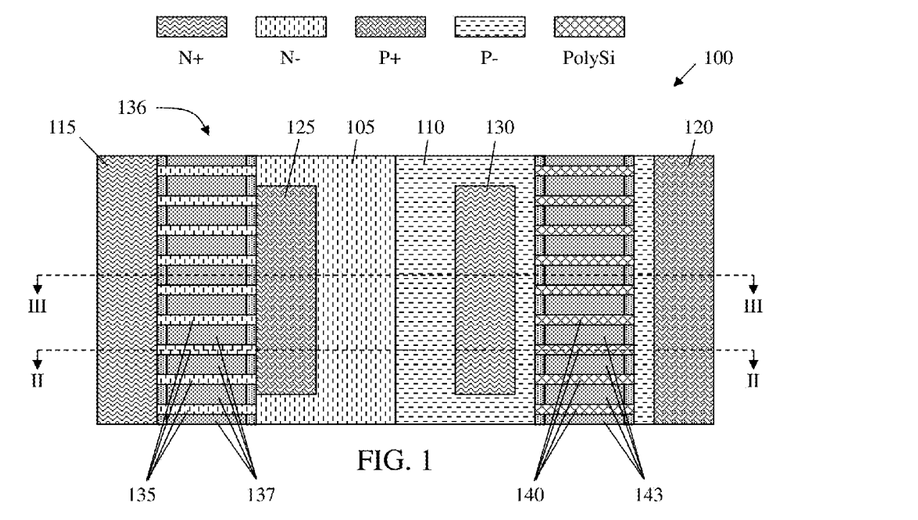
FIGS. 1-4, 5A-B, 6A-B, 7A-B, 8A-B, 9A-B, 10A-B, 11A-B, 12A-B, 13A-C, and 14-21 show views of structures and respective processing steps in accordance with aspects of the invention.
Figure 2:
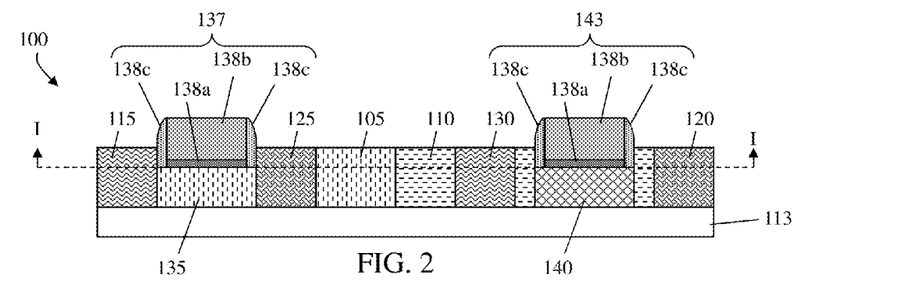
Figure 3:
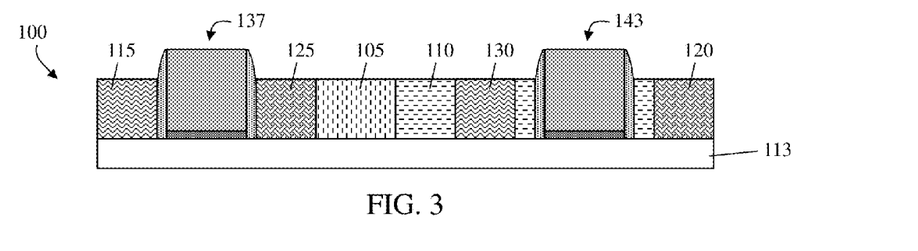

FIGS. 1-3 show an exemplary embodiment of an SCR 100 in accordance with aspects of the invention. FIG. 1 shows a top view of SCR 100 along line I-I of FIG. 2. FIG. 2 shows a cross section of SCR 100 along line II-II of FIG. 1. FIG. 3 shows a cross section of SCR 100 along line III-III of FIG. 1.

As shown in FIGS. 1-3, SCR 100 includes an n-well 105 and a p-well 110 formed on a buried oxide (BOX) layer 113 of an SOI substrate. The SCR 100 also includes an n-well body contact 115, a p-well body contact 120, an anode 125 in the n-well 105, and a cathode 130 in the p-well 110. In embodiments, n-well 105 is composed of semiconductor material (e.g., silicon, etc.) that is doped with n-type impurity such as phosphorous, arsenic, antimony, bismuth, etc. In aspects of the invention, n-well 105 is lightly doped, e.g., N−. P-well 110 may be composed of semiconductor material (e.g., silicon, etc.) that is doped with p-type impurity such as boron, indium, gallium, etc. In aspects of the invention, p-well 110 is lightly doped, e.g., P−. In embodiments, n-well body contact 115 and cathode 130 are composed of semiconductor material (e.g., silicon, etc.) that is heavily doped with the same conductivity type impurity as n-well 105, e.g., N+. P-well body contact 120 and anode 125 may be composed of semiconductor material (e.g., silicon, etc.) that is heavily doped with the same conductivity type impurity as p-well 100, e.g., P+.

In accordance with aspects of the invention, SCR 100 includes a plurality of fingers 135 at a junction region 136 between n-well body contact 115 and anode 125, as shown in FIG. 1. In embodiments, fingers 135 are fin-shaped structures composed of the same material as n-well 105, e.g., semiconductor material (e.g., silicon, etc.) that is lightly doped with n-type impurity (e.g., N−). In aspects of the invention, dielectric structure 137 is arranged between respective ones of fingers 135. In embodiments, the dielectric structure 137 comprises a gate stack including a gate dielectric 138a, a non-conductive gate body 138b, and sidewalls spacers 138c, as shown in FIGS. 2 and 3 and as described in greater detail herein. The invention is not limited to this form of dielectric structure, however, and any suitable non-conducting structure may be used.

As shown in FIGS. 1 and 2, some of fingers 135 are located between and directly contacting both n-well body contact 115 and anode 125 at some locations of junction region 136. As shown in FIGS. 1 and 3, some areas of dielectric structure 137 are located between n-well body contact 115 and anode 125 at other locations of junction region 136. In this manner, fingers 135 and dielectric structure 137 alternate in the junction region 136 between n-well body contact 115 and anode 125. In embodiments, at least one fin 135 extends between and directly contacts both n-well body contact 115 and n-well 105 to provide a bias to n-well 105, e.g., to prevent n-well 105 from floating.

Alternating fingers 135 and dielectric structure 137 in junction region 136 reduces the amount of semiconductor material in junction region 136, e.g., compared to an SCR in which the entire junction region 136 is made up of semiconductor material. As depicted in FIG. 1, junction region 136 makes up a portion of the anode 125/n-well 105 junction. As such, reducing the amount of semiconductor material in junction region 136 also reduces the amount of semiconductor material in the anode 125/n-well 105 junction, which reduces the area and thus the capacitance of the anode 125/n-well 105 junction. As is evident from FIGS. 1-3, the main current path for ESD protection in SCR 100 extends between anode 125, n-well 105, p-well 110, and cathode 130. As such, junction region 136 does not contribute to the main current path, and implementations of the invention reduce the capacitive load of SCR 100 by reducing the amount of semiconductor material in junction region 136.

With continued reference to FIGS. 1-3, embodiments of the invention may also include a plurality of fingers 140 and dielectric structure 143 formed in p-well 110 between cathode 130 and p-well body contact 120. In embodiments, fingers 140 are fin-shaped structures composed of intrinsic silicon (e.g., undoped or very lightly doped silicon). In other embodiments, fingers 140 are composed of the same material as p-well 110, e.g., semiconductor material that is lightly doped with p-type impurity (e.g., P−). In aspects of the invention, dielectric structure 143 is arranged between respective ones of the fingers 140 and may be the same as dielectric structure 137 (e.g., a gate stack). In this manner, fingers 140 and dielectric structure 143 alternate in the p-well 110 in a region between cathode 130 and p-well body contact 120, as shown in FIGS. 1-3. Alternating fingers 140 and dielectric structure 143 in p-well 110 increases the resistance in p-well 110 adjacent p-well body contact 120, which reduces the trigger current for SCR 100 and improves triggering characteristics.

In embodiments, n-well body contact 115 and anode 125 are heavily doped N+ regions, and may have a concentration about 50 to 100 times that of the N− regions, e.g., n-well 105. For example, the N− regions may have a concentration on the order of about $1 \times 10^{18}/cm^3$, and the N+ regions may have a concentration on the order of about $5 \times 10^{19}/cm^3$ to $1 \times 10^{20}/cm^3$, although the invention is not limited to these values and any suitable concentrations may be used. The P+ regions (e.g., the p-well body contact 120 and the cathode 130) and the P− regions (e.g., the p-well) may have a similar concentration ratio as the N+ to N− ratio, e.g., about 50:1 to 100:1. The invention is not limited to these particular concentrations, however, and other suitable concentrations may be used.

Figure 4:
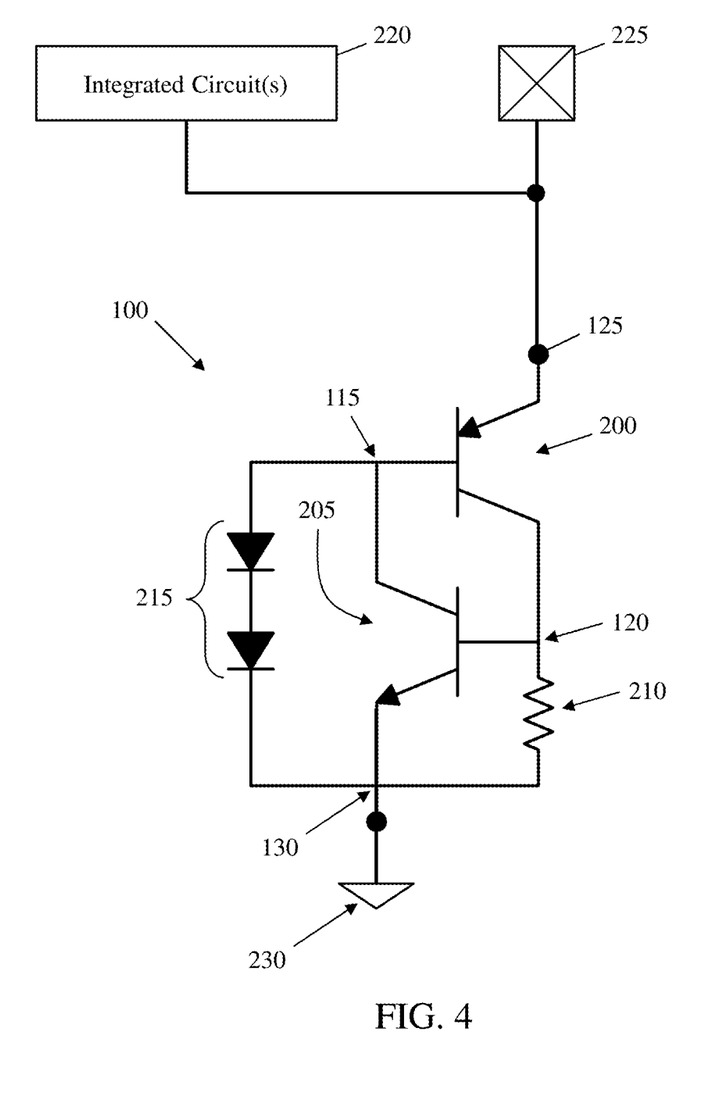

FIG. 4 is a schematic view of the electrical configuration of SCR 100 of FIGS. 1-3 implemented as a DTSCR in accordance with aspects of the invention. In embodiments, SCR 100 includes a PNP bipolar transistor 200 that is cross coupled with an NPN bipolar transistor 205. The PNP bipolar transistor 200 is defined by anode 125, n-well body contact 115, and p-well body contact 120. The NPN bipolar transistor is defined by n-well body contact 115, p-well body contact 120, and cathode 130. The electrical resistance of the p-well is represented by resistor 210. Diode string 215 provides a voltage trigger network characterized by a triggering voltage and a triggering current for SCR 100 to enter the low impedance state.

In embodiments, SCR 100 may be used to provide ESD protection to one or more integrated circuits on a chip. To this end, anode 125 and integrated circuit(s) 220 are electrically coupled by a shared signal path to I/O pad 225, and cathode 130 is connected to ground 230. In this manner, SCR 100 may provide a low impedance path between I/O pad 225 and ground 230 during an ESD event, thereby diverting the current of the ESD event from reaching and damaging the integrated circuit(s) 220 on the chip. When the chip is in a powered condition during normal operation (e.g., a non-ESD situation), SCR 100 presents a high impedance path between I/O pad 225 and ground 230 so that signals communicated over the signal path between I/O pad 225 and integrated circuit(s) 220 are unaffected by the presence of SCR 100. As described above, the triggering current is used to control when SCR 100 is in the low impedance state.

Figure 5A:
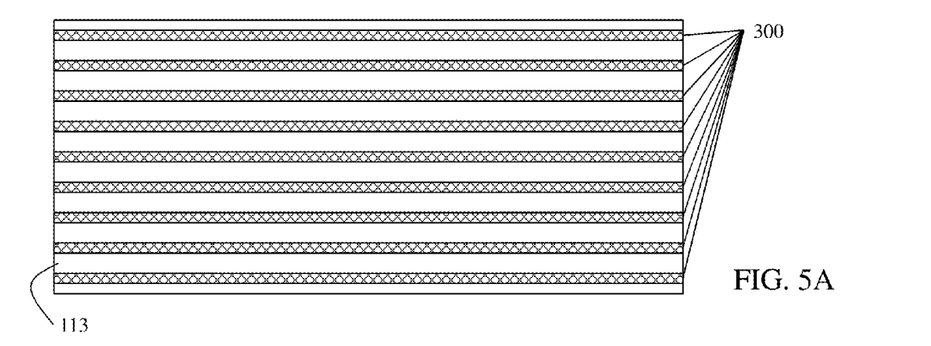
Figure 5B:
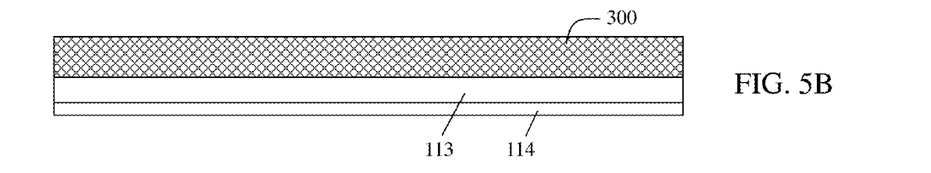

FIGS. 5A-21 show processing steps and structures associated with forming a semiconductor device in accordance with aspects of the invention. FIGS. 5A and 5B show a top view and a side cross-section view, respectively, of the semiconductor structure during a stage of manufacture. As depicted in FIGS. 5A and 5B, fins 300 of semiconductor material are formed on an insulator layer 113 atop a substrate 114 (shown only in FIG. 5B for clarity). The fins 300 may comprise, for example, a monolith of silicon or any other suitable semiconductor material formed on the insulator layer 113 using conventional semiconductor processing techniques used in forming fins in finFETs (e.g., photolithographic masking and etching a top layer of an SOI wafer, sidewall image transfer, etc.). In embodiments, the insulator layer 113 comprises a buried oxide (BOX) layer formed atop the substrate 114 in any desired conventional manner. In an exemplary, non-limiting embodiment, the substrate 114 and insulator layer 113 are part of an SOI wafer, and fins 300 are formed from the active layer of semiconductor material atop the insulator layer 113 in the SOI wafer. The fins 300 may have any desired height and width, and any suitable number of fins 300 may be used within the scope of the invention.

Figure 6A:
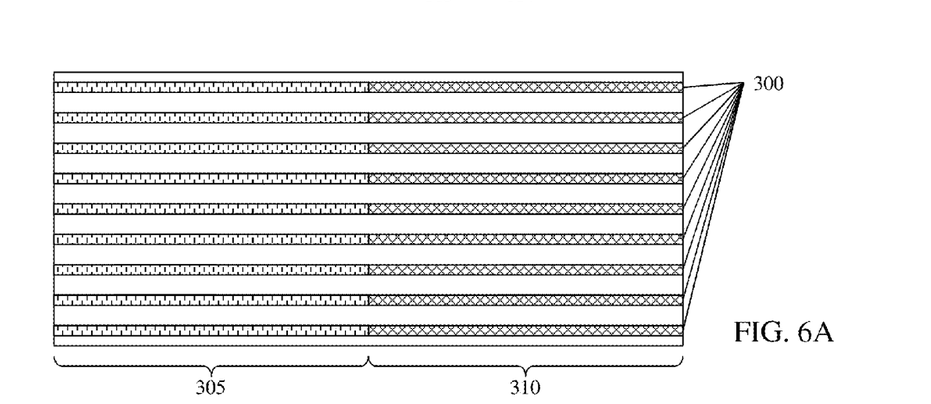
Figure 6B:
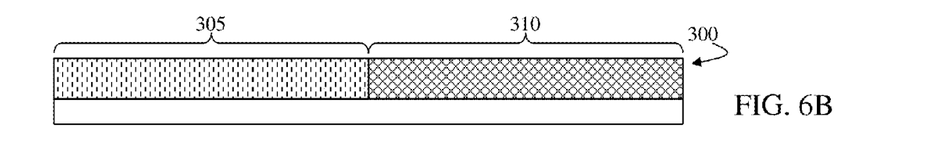

FIGS. 6A and 6B show a top view and a side cross-section view, respectively, of the semiconductor structure during a stage of manufacture. As depicted in FIGS. 6A and 6B, a first side 305 of each fin 300 is doped with an n-type impurity. The doping may be performed using conventional semiconductor manufacturing processes, such as a conventional ion-implantation process. For example, a mask (e.g., a conventional photomask) may be formed over a second side 310 of fins 300, and n-type ions may be implanted into the first side 305 of fins 300 at a desired energy and concentration. The mask may be removed following the ion-implantation process. In embodiments, the first side 305 of fins 300 is lightly doped, e.g., N–.

Figure 7A:
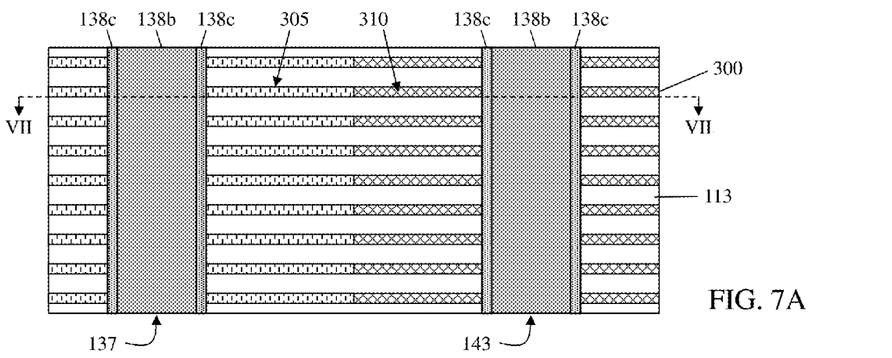
Figure 7B:
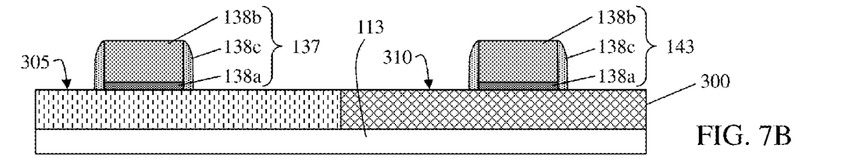

FIG. 7A is a top view and FIG. 7B is a side cross-section view along line VII-VII of the semiconductor structure during a stage of manufacture. As depicted in FIGS. 7A and 7B, a dielectric structure 137 is formed on first side 305 of fins 300, and dielectric structure 143 is formed on second side 310 of fins 300. As described with respect to FIGS. 1-3, dielectric structure 137 may comprise a gate stack including a gate dielectric 138a, a gate body 138b, and sidewalls spacers 138c formed using conventional semiconductor manufacturing processes and materials. For example, gate dielectric 138a may be any suitable gate dielectric material (e.g., hafnium oxide, etc.) deposited, for example, using chemical vapor deposition (CVD) or the like. Gate body 138b may comprise, for example, undoped polysilicon formed using CVD. Gate dielectric 138a and gate body 138b may be patterned to a desired shape after deposition, e.g., using photolithographic masking and etching. Sidewall spacers 138c may comprise, for example, silicon oxide, silicon nitride, silicon oxynitride, or the like, and may be formed, for example, by deposition of a conformal dielectric material layer and an anisotropic etch that removes horizontal portions of the conformal dielectric material layer.

In accordance with aspects of the invention, the dielectric structure 137 is conformally formed on top of fins 300 and also on the insulator layer 113 in the spaces between fins 300. In embodiments, dielectric structure 143 formed on second side 310 of fins 300 is similar to dielectric structure 137 (e.g., a gate stack including a gate dielectric 138a, a gate body 138b, and sidewalls spacers 138c), and dielectric structure 137 and dielectric structure 143 may be simultaneously formed using same processes.

Figure 8A:
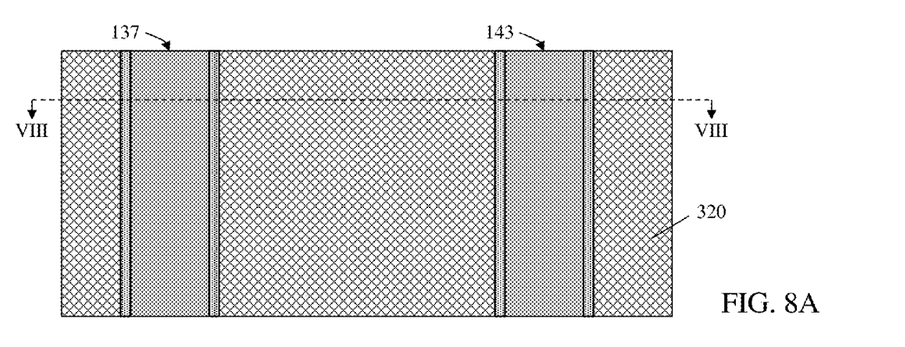
Figure 8B:
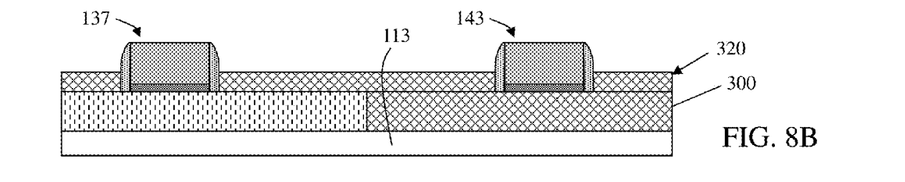

FIG. 8A is a top view and FIG. 8B is a side cross-section view along line VIII-VIII of the semiconductor structure during a stage of manufacture. As depicted in FIGS. 8A and 8B, in embodiments, silicon is epitaxially grown from exposed surfaces of fins 300, e.g., on top and side surfaces of fins 300 that are not covered by dielectric structure 137 and dielectric structure 143. The epitaxially grown silicon fills the spaces between fins 300 on insulator layer 113, e.g., merges the fins 300 together where not covered by dielectric structure 137 and dielectric structure 143. The epitaxially grown silicon also forms an upper layer 320 of intrinsic silicon on and over fins 300.

Figure 9A:
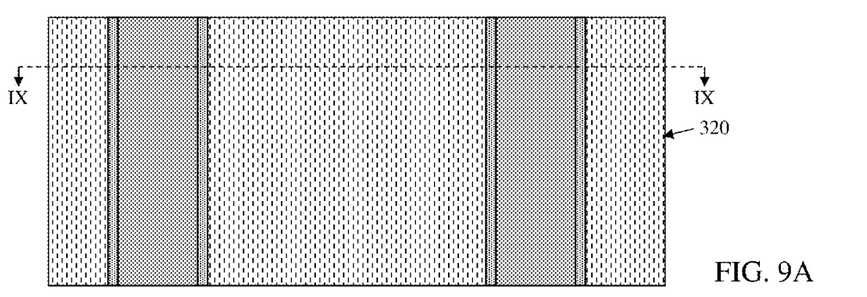
Figure 9B:
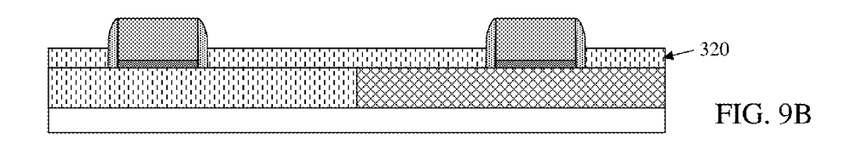

FIG. 9A is a top view and FIG. 9B is a side cross-section view along line IX-IX of the semiconductor structure during a stage of manufacture. As depicted in FIGS. 9A and 9B, a shallow n-type ion-implantation is performed on the entire structure, which results in the upper layer 320 being doped N–. In embodiments, the shallow ion-implantation process is performed at a suitable energy to substantially confine the ion-implantation to the upper layer 320.

Figure 10A:
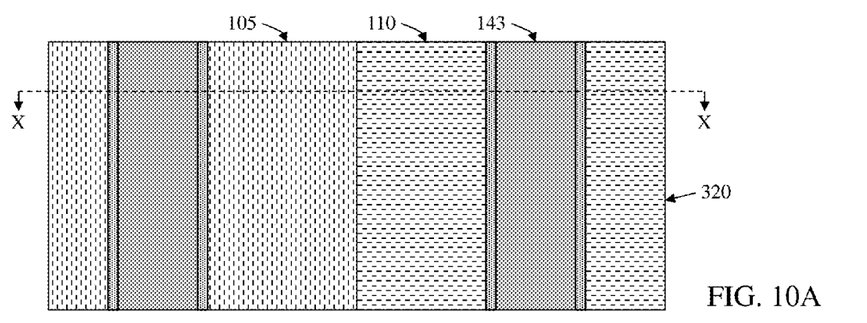
Figure 10B:
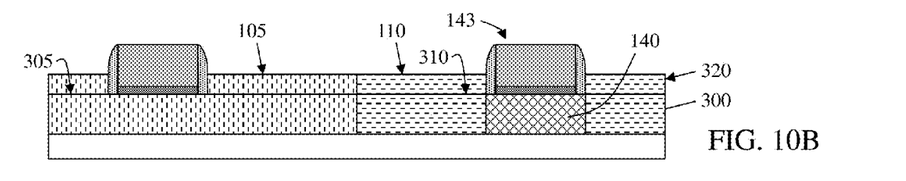

FIG. 10A is a top view and FIG. 10B is a side cross-section view along line X-X of the semiconductor structure during a stage of manufacture. As depicted in FIGS. 10A and 10B, a p-well implant is performed. In embodiments, a first side of the structure (e.g., corresponding to the first side 305 of fins 300) is masked, and a second side of the structure (e.g., corresponding to the second side 310 of fins 300) is doped with a p-type impurity. The doping may comprise one or more ion-implantation steps. For example, a first step may include a shallow p-type ion-implantation of upper layer 320 to counterdope the n-type impurity in this layer, and a second step may include a deeper p-type ion-implantation of the intrinsic silicon that is underneath upper layer 320. The ion-implantation depicted at FIGS. 10A and 10B results in the formation of p-well 110 that is lightly doped, e.g., P–. According to aspects of the invention, dielectric structure 143 masks the ion-implantation depicted at FIGS. 10A and 10B, such that fingers 140 (e.g., the portion of fins 300 underneath dielectric structure 143) remain as intrinsic silicon (e.g., undoped).

As depicted in FIGS. 10A and 10B, the p-well 110 includes a p-type doped portion of layer 320 and a p-type doped portion of merged fins 300 at the second side 310. Additionally, the n-well includes an n-type doped portion of layer 320 and an n-type doped portion of merged fins 300 at the first side 305.

With continued reference to FIGS. 10A and 10B, following the p-well implant, masking and ion-implantation steps may be used to form the n-well body contact, p-well body contact, anode, and cathode, e.g., to arrive at the structure shown in FIGS. 1-3. The ion-implantation processes used to form the n-well, p-well, n-well body contact, p-well body contact, anode, and cathode may be tailored to provide an N+ to N– ratio of about 50:1 to 100:1, and a P+ to P– ratio of about 50:1 to 100:1

Figure 11A:
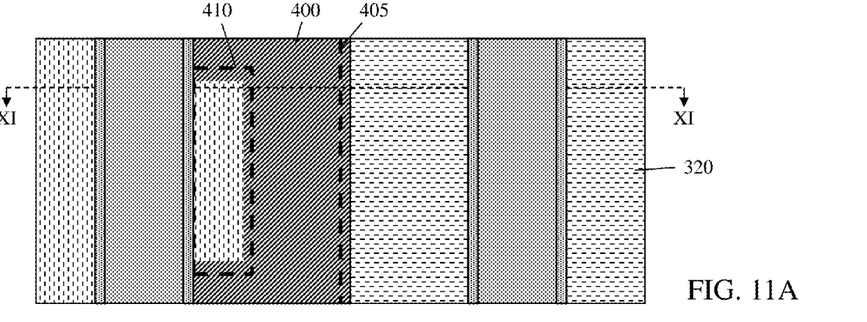
Figure 11B:
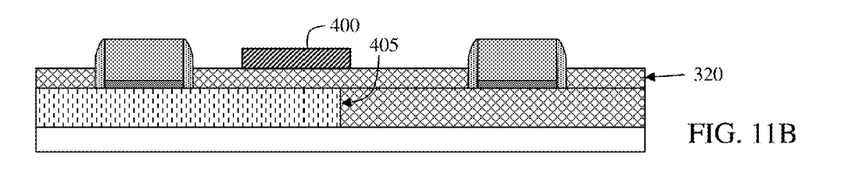

FIG. 11A is a top view and FIG. 11B is a side cross-section view along line XI-XI of the semiconductor structure during a stage of manufacture. In embodiments, additional semiconductor material is formed in the SCR prior to forming the form the n-well body contact, p-well body contact, anode, and cathode. For example, as depicted in FIGS. 11A and 11B, and starting from the structure of FIGS. 8A and 8B, a blocking spacer 400 may be formed on the top surface of layer 320 prior to the shallow N– implant and P– implant. In embodiments, blocking spacer 400 covers an area where a junction 405 will be formed between the n-well and p-well, as well as an area where a junction 410 will be formed between the anode and n-well. The blocking spacer 400 may be formed using conventional processing techniques and materials, e.g., CVD of nitride followed by patterning using masking and etching.

Figure 12A:
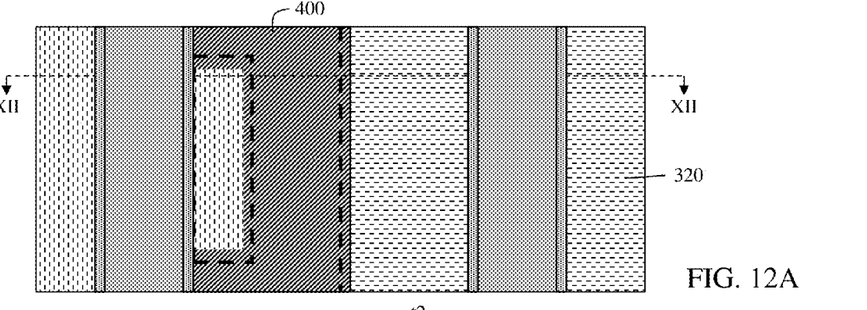
Figure 12B:
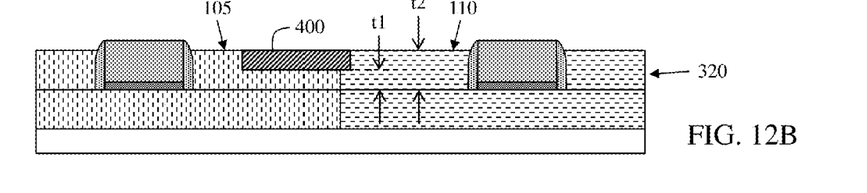

FIG. 12A is a top view and FIG. 12B is a side cross-section view along line XII-XII of the semiconductor structure during a stage of manufacture. As depicted in FIGS. 12A and 12B, silicon is epitaxially grown from exposed portions of layer 320, e.g., on surfaces that are not covered by blocking spacer 400. This growth step increases the vertical thickness of layer 320 from t1 to t2 in areas that are not covered by blocking spacer 400. Following the epitaxial growth to increase the thickness from t1 to t2, the n-well 105 and p-well 110 are formed by subjecting selected portions of the structure to a shallow N− implant and a shallow P− implant, e.g., in a manner similar to that described with respect to FIGS. 9 and 10.

Figure 13A:
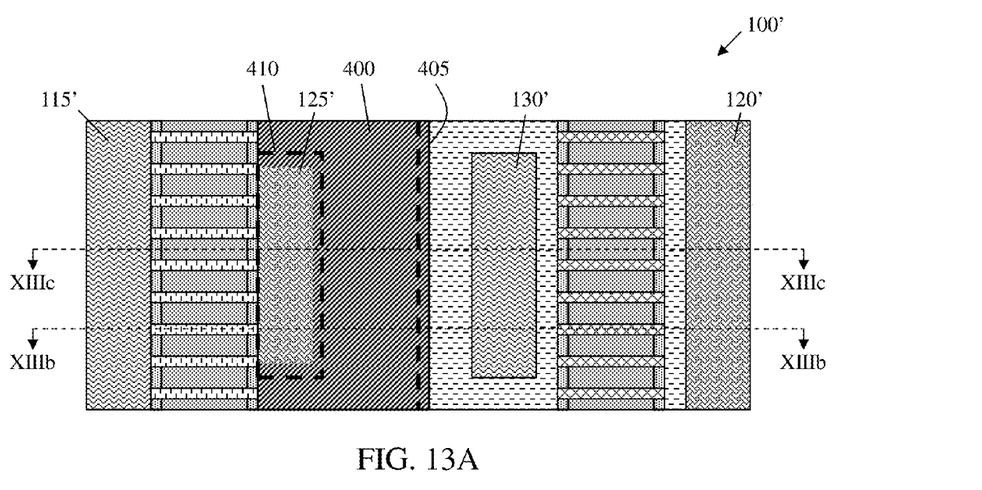
Figure 13B:
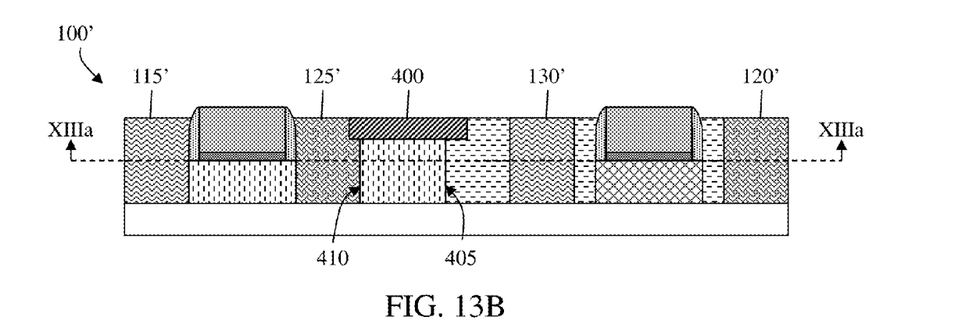
Figure 13C:
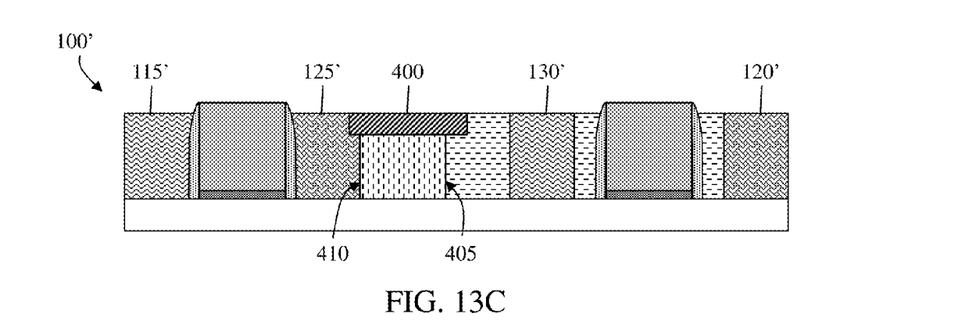

FIGS. 13A-C show a top view and a side cross-section views of the semiconductor structure during a stage of manufacture. Similar to FIGS. 1-3, FIG. 13A shows a top view, FIG. 13B shows a cross section along line XIIIb-XIIIb, and FIG. 13C shows a cross section along line XIIIc-XIIIc. FIG. 13A is viewed along line XIIIa-XIIIa of FIG. 13B. As shown in FIGS. 13A-C, after the epitaxial growth step to increase the silicon thickness and the shallow N− implant and a shallow P− implant, the n-well body contact 115', p-well body contact 120', anode 125', and cathode 130' are formed using masking and ion-implantation processes, e.g., in a manner similar to that described herein. The increased thickness of the silicon, e.g., t2, provides additional ESD protection compared to the smaller thickness, e.g., t1, by increasing the volume of semiconductor material in the SCR. Blocking spacer 400 formed over junctions 405 and 410 results in the cross sectional area of junctions 405 and 410 remaining the same when layer 320 is increased in thickness from t1 to t2. Since the capacitance of the SCR 100' is a function of the cross sectional area of these junctions 405 and 410, blocking spacer 400 and layer 320 having increased thickness t2 provide a higher level of ESD protection at substantially a same capacitance, e.g., compared to a layer 320 having thickness t1.

Figure 14:
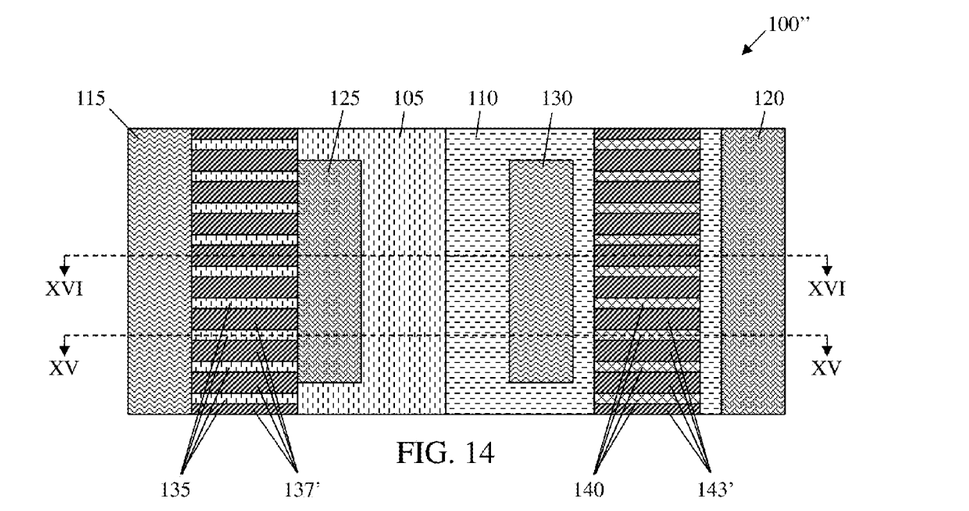
Figure 15:
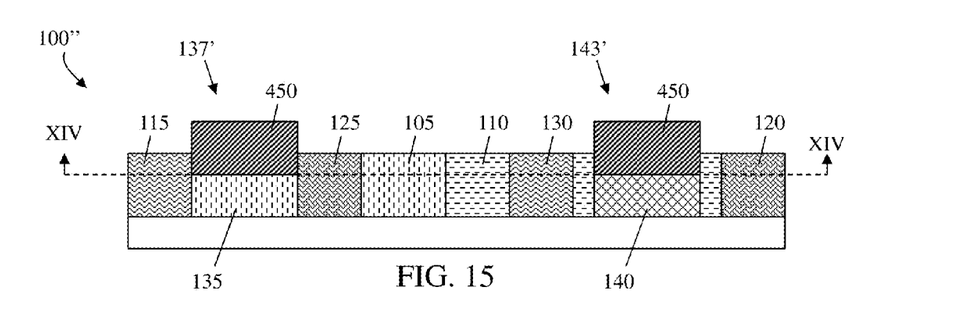
Figure 16:
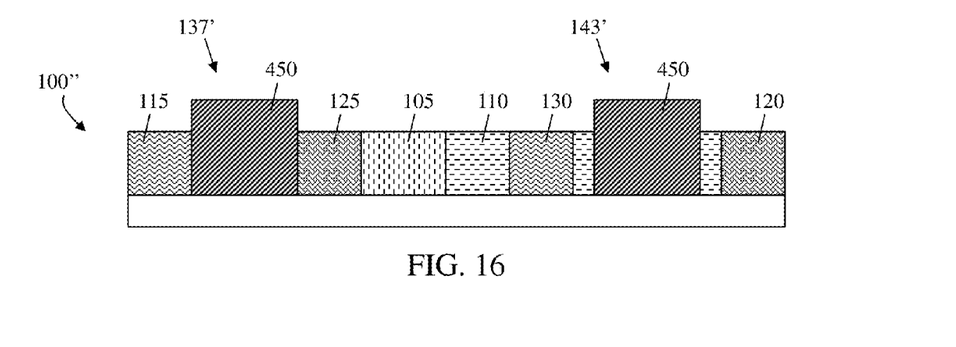

FIGS. 14-16 show a top view and a side cross-section views of a semiconductor structure during a stage of manufacture. Similar to FIGS. 1-3, FIG. 14 shows a top view, FIG. 15 shows a cross section along line XV-XV, and FIG. 16 shows a cross section along line XVI-XVI. FIG. 14 is viewed along line XIV-XIV of FIG. 15. In embodiments, the dielectric structures formed between fingers 135 and formed between fingers 140 may be something other than the gate structures described with respect to FIGS. 1-3. For example, as shown in FIGS. 14-16, the dielectric structures 137' and 143' may comprise a hard mask 450 composed of, for example, silicon oxide, silicon nitride, silicon oxynitride, or the like. The hard mask 450 may be formed using conventional semiconductor manufacturing processes, such as CVD, masking, and patterning. In embodiments, the hard mask 450 may be formed at the same stage as the gate structures, e.g., as shown at FIGS. 7A and 7B, and other processing steps may be the same as those described with respect to FIGS. 5A-10A. The resulting SCR 100" includes n-well 105, p-well 110, n-well body contact 115, p-well body contact 120, anode 125, cathode 130, fingers 135, and fingers 140.

Figure 17:
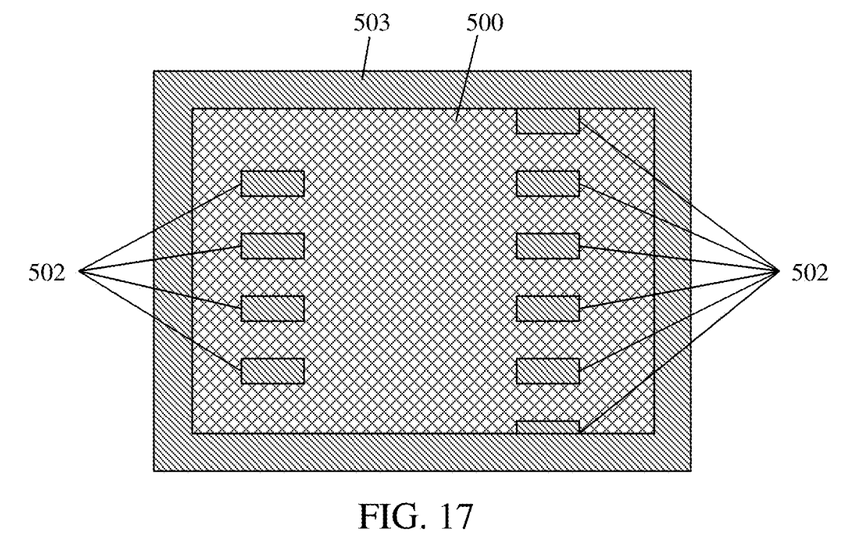

FIGS. 17-21 show a further embodiment in accordance with aspects of the invention. FIG. 17 shows a top view of an active semiconductor layer 500 of an SOI wafer (e.g., the layer of semiconductor material formed on the BOX layer of the SOI wafer) in which shallow trench isolation (STI) elements 502 and 503 are formed. The STI elements 502 may be formed using conventional STI manufacturing processes, such as masking and etching portions of layer 500 to form trenches, filling the trenches with STI material, e.g., oxide, nitride, etc., and optionally planarizing the structure, e.g., using chemical mechanical polish (CMP) or the like.

Figure 18:
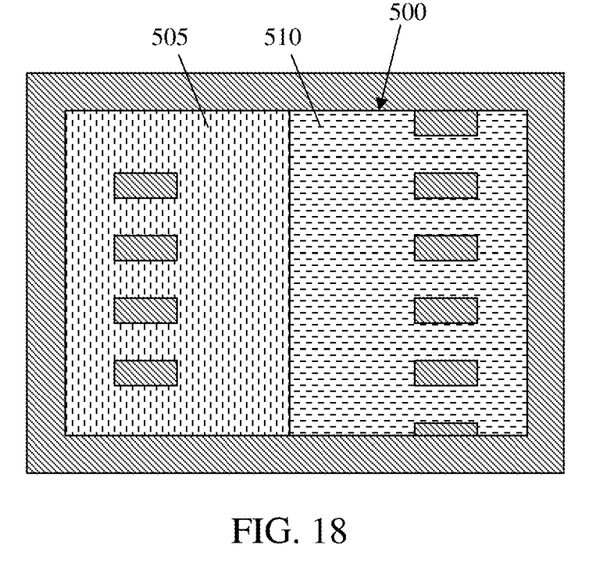

As shown in FIG. 18, an n-well 505 is formed in a first portion of layer 500 and a p-well 510 is formed in a second portion of layer 500. The n-well 505 and p-well 510 may be formed using conventional processes, such as respective masking and ion-implantation steps for each well.

Figure 19:
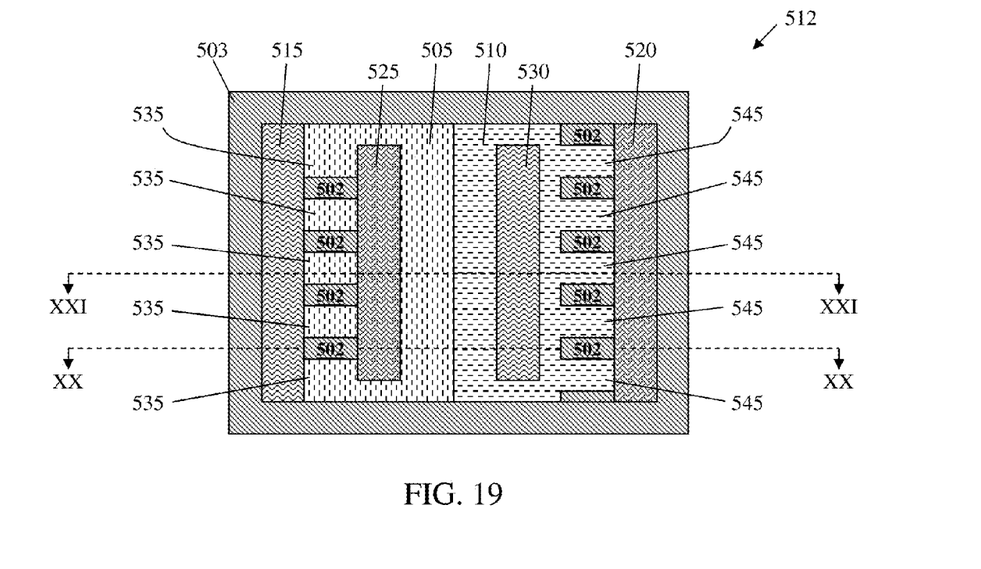
Figure 20:
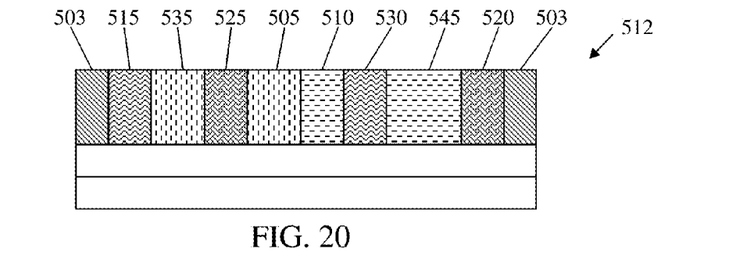
Figure 21:
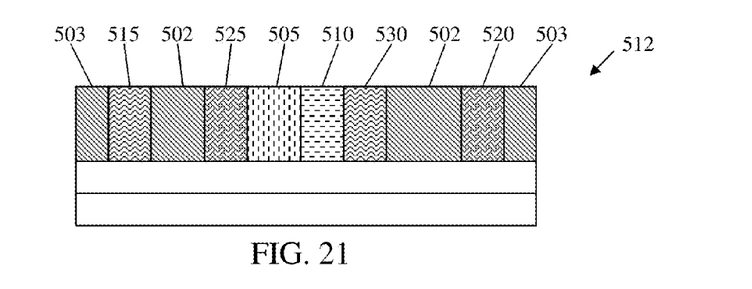

FIGS. 19-20 show a top view and side cross-section views of SCR 512 after forming the n-well body contact 515, p-well body contact 520, anode 525, and cathode 530, all of which are formed in layer 500. FIG. 19 shows a top view, FIG. 20 shows a cross section along line XX-XX, and FIG. 21 shows a cross section along line XXI-XXI. The n-well body contact 515, p-well body contact 520, anode 525, and cathode 530 may be formed using conventional processes, such as respective masking and ion-implantation steps. In embodiments, n-well 505 is lightly doped (N−), n-well body contact 515 and cathode 530 are heavily doped (N+), p-well 510 is lightly doped (P−), and p-well body contact 520 and anode 525 are heavily doped (P+). In embodiments, STI element 503 surrounds the SCR 512 to provide isolation.

In accordance with aspects of the invention, STI elements 502 define N− fingers 535 between n-well body contact 515 and anode 525, and P− fingers 545 between p-well body contact 520 and cathode 530. The STI elements 502 thus constitute dielectric strictures between the fingers. The alternating STI elements 502 and N− fingers 535 reduce the amount of semiconductor material between n-well body contact 515 and anode 525 (e.g., compared to an SCR without STI elements 502), and the reduction of semiconductor material in this region reduces the capacitive load of the SCR 512. The alternating STI elements 502 and P-fingers 545 reduce the amount of semiconductor material between p-well body contact 520 and cathode 530 (e.g., compared to an SCR without STI elements 502), and the reduction of semiconductor material in this region increases the resistance of p-well 510, which affects the trigger voltage and current of the SCR 512.

Figure 22:
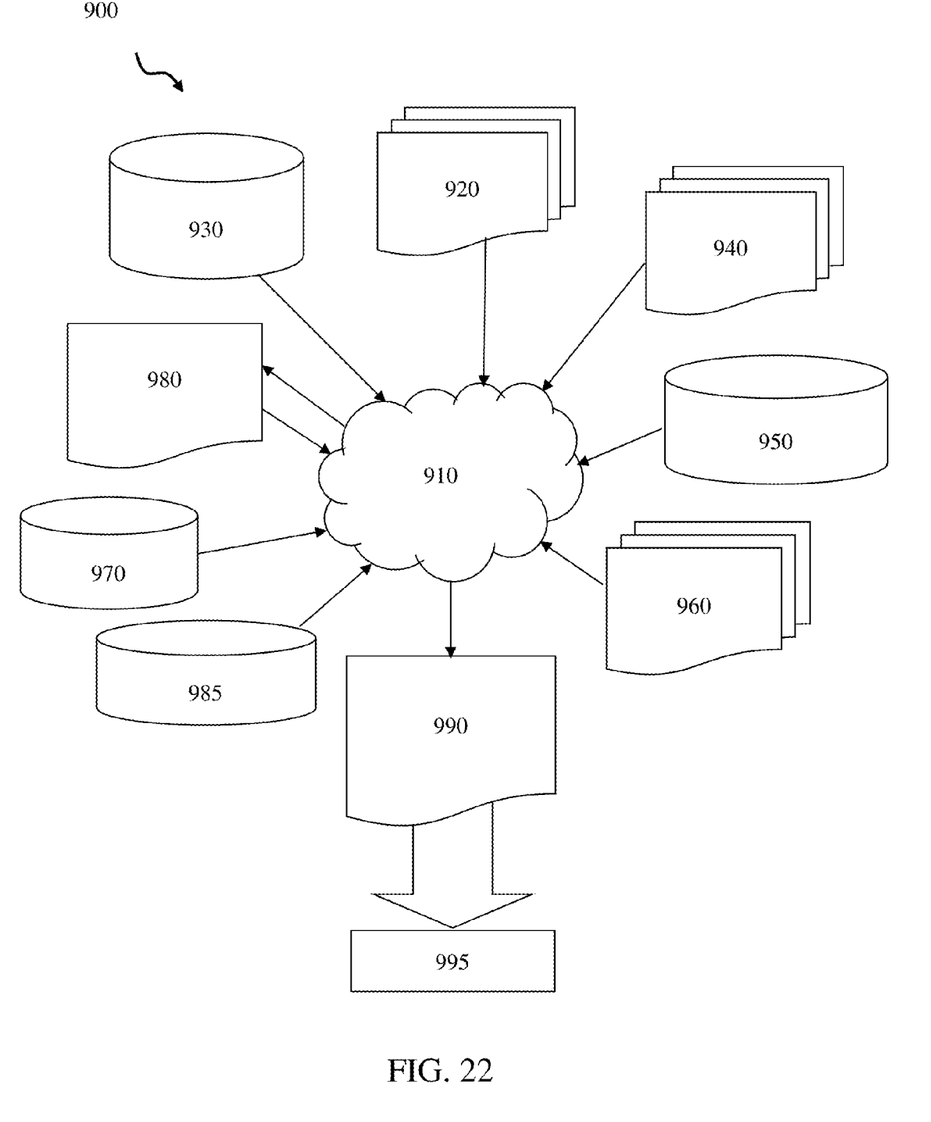
FIG. 22 is a flow diagram of a design process used in semiconductor design, manufacture, and/or test.

FIG. 22 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-21. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 22 illustrates multiple such design structures including an input design structure 920 that is preferably processed by a design process 910. Design structure 920 may be a logical simulation design structure generated and processed by design process 910 to produce a logically equivalent functional representation of a hardware device. Design structure

920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-21. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-21 to generate a Netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-21. In one embodiment, design structure 990 may comprise a compiled, executable HDL simulation model that functionally simulates the devices shown in FIGS. 1-21.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-21. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of manufacturing a semiconductor structure, comprising:
forming a semiconductor controlled rectifier comprising a first plurality of fingers of semiconductor material between an n-well body contact and an anode in an n-well, and a second plurality of fingers of semiconductor material between a p-well body contact and a cathode in a p-well,
wherein the semiconductor controlled rectifier comprises:
a first dielectric structure on and between ones of the first plurality of fingers of semiconductor material; and a second dielectric structure on and between ones of the second plurality of fingers of semiconductor material.

2. The method of claim 1, wherein:
the first dielectric structure comprises a first gate stack; and
the second dielectric structure comprises a second gate stack.

3. The method of claim 2, wherein:
the first gate stack includes a first gate dielectric, a first non-conductive gate body, and first sidewall spacers; and
the second gate stack includes a second gate dielectric, a second non-conductive gate body, and second sidewall spacers.

4. The method of claim 1, wherein the first dielectric structure directly contacts: each of the first plurality of fingers of semiconductor material; a buried oxide layer; the n-well body contact; and the anode.

5. The method of claim 1, wherein:
a first one of the first plurality of fingers of semiconductor material has a first end directly contacting the n-well body contact and a second end directly contacting the anode; and
a second one of the first plurality of fingers of semiconductor material has a first end directly contacting the n-well body contact and a second end directly contacting the n-well.

6. The method of claim 1, wherein each of the second plurality of fingers of semiconductor material has respective ends directly contacting the p-well without directly contacting the cathode or the p-well body contact.

7. The method of claim 1, wherein each of the second plurality of fingers of semiconductor material is composed of intrinsic polysilicon.

8. The method of claim 7, wherein the intrinsic polysilicon is different than a material of the p-well.

9. A method of manufacturing a semiconductor structure, comprising:
forming a semiconductor controlled rectifier comprising a first plurality of fingers between an n-well body contact and an anode in an n-well, and a second plurality of fingers between a p-well body contact and a cathode in a p-well, wherein the forming the semiconductor controlled rectifier comprises:
forming a plurality of fins;
forming a first dielectric structure on and between ones of the plurality of fins;
forming a second dielectric structure on and between the ones of the plurality of fins;
forming a semiconductor material layer by merging the plurality of fins where the plurality of fins are uncovered by the first dielectric structure and the second dielectric structure;
forming the n-well, the n-well body contact, and the anode in a first region of the semiconductor material layer; and
forming the p-well, the p-well body contact, and the cathode in a second region of the semiconductor material layer.

10. The method of claim 9, wherein:
the first plurality of fingers comprises first portions of the plurality of fins covered by the first dielectric structure and between the n-well body contact and the anode; and
the second plurality of fingers comprises second portions of the plurality of fins covered by the second dielectric structure and between the p-well body contact and the cathode.

11. The method of claim 10, further comprising doping the first plurality of fingers a same conductivity type as the n-well.

12. The method of claim 9, wherein:
the forming the first dielectric structure comprises forming a first gate stack at a first location on and between the ones of the plurality of fins; and
the forming the second dielectric structure comprises forming a second gate stack at a second location on and between the ones of the plurality of fins.

13. The method of claim 9, wherein:
the forming the first dielectric structure comprises forming a first hard mask at a first location on and between the ones of the plurality of fins; and
the forming the second dielectric structure comprises forming a second hard mask at a second location on and between the ones of the plurality of fins.

14. The method of claim 9, wherein the merging the plurality of fins comprises epitaxially growing semiconductor material on the plurality of fins.

15. The method of claim 9, further comprising:
forming a blocking spacer on an upper surface of the semiconductor material layer; and
increasing a thickness of the semiconductor material layer in regions that are uncovered by the blocking spacer.

16. The method of claim 15, wherein the forming the blocking spacer comprises forming the blocking spacer over junction regions of the semiconductor controlled rectifier.

* * * * *